(12) United States Patent
Oota et al.

(10) Patent No.: US 6,521,918 B2
(45) Date of Patent: *Feb. 18, 2003

(54) SEMICONDUCTOR DEVICE AND DRIVING METHOD THEREOF

(75) Inventors: Kenji Oota, Tokyo (JP); Kazuhiro Morishita, Tokyo (JP); Katsumi Satoh, Tokyo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/566,738

(22) Filed: May 9, 2000

(65) Prior Publication Data

US 2002/0105006 A1 Aug. 8, 2002

Related U.S. Application Data

(63) Continuation of application No. PCT/JP98/04057, filed on Sep. 10, 1998.

(51) Int. Cl.$^7$ ............................................... H01L 31/111
(52) U.S. Cl. ..................... 257/107; 257/109; 257/110; 257/115
(58) Field of Search ............................... 257/107, 109, 257/115, 110

(56) References Cited

U.S. PATENT DOCUMENTS

| | | | | |
|---|---|---|---|---|
| 4,224,634 A | * | 9/1980 | Svedberg | 357/38 |
| 4,599,633 A | * | 7/1986 | Thire | 357/38 |
| 5,369,291 A | * | 11/1994 | Swanson | 257/130 |
| 5,428,228 A | * | 6/1995 | Ogura | 257/138 |
| 5,446,295 A | * | 8/1995 | Whitney | 257/113 |
| 5,475,243 A | * | 12/1995 | Saito | 257/171 |
| 5,578,522 A | * | 11/1996 | Nakamura | 257/107 |
| 5,659,185 A | * | 8/1997 | Iwamuro | 257/138 |
| 5,710,442 A | * | 1/1998 | Watanabe | 257/107 |
| 5,777,346 A | * | 7/1998 | Temple | 257/120 |
| 5,856,683 A | * | 1/1999 | Schlangenotto | 257/139 |
| 6,034,381 A | * | 3/2000 | Pezzani | 257/107 |

FOREIGN PATENT DOCUMENTS

| | | | |
|---|---|---|---|
| FR | 002566582 A1 | * | 12/1985 |
| JP | 5-90571 | | 4/1993 |
| JP | 405190839 A | * | 7/1993 |
| JP | 405326934 A | * | 12/1993 |
| JP | 6-163885 | | 6/1994 |
| JP | 406188410 A | * | 7/1994 |

OTHER PUBLICATIONS

International Search Report.

* cited by examiner

*Primary Examiner*—Olik Chaudhuri
*Assistant Examiner*—Nathan W. Ha
(74) *Attorney, Agent, or Firm*—Oblon, Spivak, McClelland, Maier & Neustadt, P.C.

(57) ABSTRACT

To make it possible to control turn-off operation even after switch over to transistor operation after commutation of the main current from cathode electrode to gate electrode in turn-off operation, a semiconductor device according to the invention comprises a first electrode, a first region of first conduction type provided on the first electrode, a second region of second conduction type provided on the first region, a third region and a fourth region of first conduction type respectively provided on the second region with a predetermined distance from each other to allow formation of a channel region on the second region, a fifth region of second conduction type provided on the third region, a second electrode provided on the fifth region, a gate electrode established in contact with the fourth region and a control electrode provided on a separate region between the third and fourth regions on the second region to control the channel region through an insulation layer.

8 Claims, 5 Drawing Sheets

BACKGROUND ART

SEMICONDUCTOR DEVICE AND DRIVING METHOD THEREOF

CROSS-REFERENCE TO THE RELATED APPLICATION

This application is a continuation of International Application No. PCT/JP98/04057, whose international filing date is Sep. 10, 1998, the disclosure of which Application is incorporated by reference herein.

TECHNICAL FIELD

The present invention relates to a semiconductor device with four-layer structure (PNPN structure) such as Gate Commutated Turn-off Thyristor (GCT).

BACKGROUND ART

Semiconductor devices for a large amount of electric power have been improved to deal with a high voltage and a large amount of current. A gate commutation thyristor element, for example, allows now a maximum current of 4000A driven by DC3000V to flow without any snubber circuit.

Turn-off operation of this gate commutated turn-off thyristor element (hereinafter referred to as GCT element) is conducted by applying a negative voltage to a gate electrode. All of the main current flowing from the anode to the cathode through the GCT element is then commutated instantaneously to a gate circuit through the gate electrode. This results in a quick formation of a depletion layer in a P-N junction between a gate and a cathode, which in turn prevents the injection of electrons from the cathode.

Subsequently, when there is no injection of electrons from the cathode, the thyristor operation of PNPN structure between the anode and the cathode switches over to the transistor operation of PNP structure between the anode and the cathode. This purposefully brings about a state where there is no bias between base and emitter of the PNP transistor. Consequently, a turn-off operation can be performed in the same manner as a bias free transistor operation.

FIG. 7 is a sectional view showing an arrangement of a conventional GCT element, for example. FIG. 8 is a plan view of the GCT element in FIG. 7 viewed from the cathode side. FIG. 7 is a sectional view taken along the line A—A in FIG. 8. In the drawings, reference numeral 101 is an N-type base region of a semiconductor substrate comprised of an N-type semiconductor, and numeral 102 is a P-type emitter region comprised of a P-type semiconductor formed on one side of the main face of the N-type base region 101. Numeral 103 is a P-type base region comprised of a P-type semiconductor formed on the other side of the main face of the N-type base region 101. Numeral 104 is the N-type emitter region comprised of an N-type semiconductor selectively formed on upper part of the P-type base region 103.

Numeral 105 is a cathode electrode formed over the N-type emitter region 104. Numeral 106a is a gate electrode formed over the parts surrounded by the N-type emitter 104 of the P-type base region 103, and numeral 106b is a gate electrode formed to surround the N-type emitter 104 around the outer edge area of the P-type base region 103. Numeral 107 is an anode electrode formed over the P-type emitter region 102.

Turn-off operation of the GCT element indicated in FIGS. 7 and 8 is hereinafter described. In its on state, the main current flows from the anode electrode 107 through the GCT element to the cathode electrode 105. When switching over from this on state to an off state, a negative voltage is applied to the gate electrodes 106a and 106b to reduce an electric potential of the gate electrodes 106a and 106b to a level lower than the electric potential of the cathode electrode 105. This results in all of the main current flowing through the cathode electrode 105 being commutated to the gate electrodes 106a and 106b. Additionally, as the P-N junction between the gate and the cathode becomes reverse biased, a depletion layer is formed quickly in the P-N junction between the gate and the cathode. As a result, no more electrons are injected from the cathode electrode 105 through the P-N junction.

In this manner, when there is no more injection of electrons from the cathode electrode 105, the thyristor operation of the PNPN structure between the anode and the cathode, in which the current has been flowing through the P-type emitter region 102, the N-type base region 101, the P-type base region 103 and the N-type emitter region 104, is switched over to a PNP transistor operation between the anode and the gate, in which the current flows through the P-type emitter region 102, N-type base region 101 and the P-type base region 103. At this point, there is no application of a bias voltage between the N-type base region 101 and the P-type base region 103, and therefore vanishing of the carrier in the N-type base region 103 is not controlled from the outside. This results in an end of the turn-off state with the passage of time as the carrier continues to be vanished by repeated re-coupling.

FIG. 9 is a graph showing a current and a voltage between the anode and cathode of the conventional semiconductor device shown in FIG. 7 and FIG. 8. In the drawings, axis of ordinates plots the current (A) and the voltage (V), and axis of abscissas plots the time (sec). As maybe seen in FIG. 9, when the main current is commutated from the cathode electrode 105 to the gate electrodes 106a and 106b, the current flowing between the anode and the cathode is rapidly reduced and eventually the flow of the current stops.

Further, as may be seen in FIG. 9, when the main current is commutated from the cathode electrode 105 to the gate electrodes 106a and 106b and the thyristor operation switches over to transistor operation, a depletion layer is formed in the P-N junction between the P-type base region 103 and the N-type base region 101. And the voltage between the anode and the cathode increases in line with the spreading or extension of this depletion layer, and eventually the voltage between the anode and the cathode converges upon a predetermined voltage level.

In the case of the conventional semiconductor device shown in FIG. 7 and FIG. 8 not arranged by burying the N-type emitter region in the P-type base region but arranged by forming the N-type emitter region on the P-type base region, when starting switching operation at a high speed, the current becomes concentrated locally or partially on the P-type base region between the gate electrode and the cathode electrode. This results in the possibility of element breakdown.

To cope with this disadvantage, the Japanese Patent publication (unexamined) No. 22608/1995 discloses a thyristor in which a P⁻ region is established between the gate electrode and the cathode electrode, and an auxiliary gate electrode coated with an oxide layer is also provided on the P⁻ region. During switch operation, the carrier particle density of the P⁻ region is reduced by the auxiliary gate electrode, making it difficult for the controlling current to flow, which in turn prevents the current from being locally concentrated on the P-type base region.

The Japanese Patent publication (unexamined) No. 110068/1993 discloses a thyristor in which, in order to reduce the gate driving current in the PNPN thyristor equipped with a control gate at the time of turning off, a P-type base region and a P-type collector region are provided on the N-type base region with a predetermined distance from each other. Further, an N-type emitter region and a first cathode electrode are provided on the P-type base region, and a second cathode electrode is also provided on the mentioned P-type collector region. Furthermore, a new gate electrode coated with an oxide layer is formed between the first and second cathode electrodes. At the time of turning-off, a voltage is applied to the gate electrode to connect the P-type base region to the P-type collector region through a channel, so that the main current flowing between the anode and the cathode is switched over to the turn-off state.

However, the conventional semiconductor device arranged as mentioned above has following problems to be solved.

First, in the turning-off operation of the conventional semiconductor device of above arrangement, when commutating the main current from the cathode electrode to the gate electrode, thereby switching over from the thyristor operation to the transistor operation, there is no bias between the emitter and the base of the transistor in this transistor operation. Therefore, in the transistor operation, it becomes impossible to control the residual carrier within the semiconductor device. As a result, after switching over to a transistor state, the semiconductor device can not be controlled by any external circuit until the turn-off operation is completed.

Moreover, turn-off speed (i.e., rate of reduction in the flow of the main current) after the switch over to the transistor state is dependent on the vanishing speed of the residual carrier within the semiconductor device vanishing due to repeated re-coupling. Hence, a problem exists in that it is impossible to perform any turn-off operation at a high speed.

In this manner, at the time of transistor operation, as the time when the current flows between the anode and the cathode is prolonged, turn-off loss becomes high.

Furthermore, in the conventional semiconductor device disclosed in the Japanese Patent publication (unexamined) No. 110068/1993, the same voltage is always applied to the first and second cathode electrodes at all times. Thus, at the time of turning-off, even though the P-type base region and the P-type collector region are electrically connected through a channel formed between them, any negative voltage can not be applied to lower the electric potential of the second cathode electrode to a level below the electric potential of the first cathode electrode. Hence, a further problem exists in that the main current flowing through the first cathode electrode can not be efficiently commutated to the second cathode electrode, eventually resulting in that any turn-off at a high speed can not be achieved.

DISCLOSURE OF THE INVENTION

The present invention was made to solve the above-discussed problems incidental to the aforementioned conventional semiconductor devices. Accordingly, an object of the invention is to provide a semiconductor device and a driving method thereof capable of controlling the turn-off operation even after switching over to the transistor operation after commutating the main current flowing through the cathode electrode to the gate electrode.

Another object of the invention is to provide a semiconductor device and a driving method thereof which, upon switching over to the said transistor operation, can make a control over the vanishing speed of the internal carrier of the semiconductor device.

These objects and advantages are achieved by providing a new and improved semiconductor device comprising a first electrode, a first region of first conduction type provided on the mentioned first electrode, a second region of second conduction type provided on the mentioned first region, a third region and a fourth region of first conduction type respectively provided on the mentioned second region with a predetermined distance from each other to allow formation of a channel region on the mentioned second region (such that either the third region or the fourth region surrounds the other), a fifth region of second conduction type provided on the mentioned third region, a second electrode provided on the mentioned fifth region, a gate electrode established in contact with the mentioned fourth region and a control electrode provided on a separate region between the mentioned third and fourth regions on the mentioned second region to control the mentioned channel region through an insulation layer. In the semiconductor device of above arrangement, at the time of turning-off, a voltage is applied to the control electrode to form a channel for connecting the third region to the fourth region electrically. Further, by applying a voltage to the gate electrode, it becomes possible to commutate the main current so that the main current that has been flowing between the first and second electrodes comes to flow between the first electrode and the gate electrode. Furthermore, even after such commutation of the electrical current, by forming the channel region applying a voltage to the control electrode and by application of a voltage to the control electrode, it becomes possible to extract the residual carrier of the second region to the channel side. Thus, it becomes possible to control the residual carrier in the semiconductor device even after switching over to the transistor operation.

It is also preferable that face of the control electrode on the insulation layer side is lower than the surface of the third and fourth regions. In this case, due to the control electrode, it becomes possible to extract the residual carrier remaining deeper in the second region, as compared with an arrangement in which face of the control electrode on the insulation layer side is formed on the surface of the third and fourth regions. The residual carrier can thus be extracted more effectively from the second region.

The present invention also provides a driving method of a semiconductor device. The driving method includes a current commutation process in which, by applying a voltage to a control electrode at an on state of the mentioned semiconductor device in which a current flows between a first and second electrodes thereby forming a channel region, a third region and a fourth region become electrically connected, and by applying a voltage to a gate electrode, the current flowing between the mentioned first and second electrode is commutated to flow between the mentioned first electrode and the gate electrode, and a carrier extraction process in which, by applying a voltage to the mentioned control electrode after the mentioned current commutation process thereby forming a channel region, the mentioned third region and the fourth region are electrically connected, and residual carrier remaining in the semiconductor device is extracted from the mentioned gate electrode.

In the mentioned driving method of a semiconductor device, in the current commutation process, the main current that has been flowing between the first and second electrode can be commutated instantaneously to flow between the first and gate electrode. Furthermore, even when in the sate of transistor operation after completing the current commutation process, it becomes possible, through application of the voltage to the control electrode, to extract the residual carrier remaining in the semiconductor device from the gate electrode. As a result, it is possible to control the turn-off operation even in the state of transistor operation, and the turn-off loss can be reduced and the turn-off speed can be increased.

It is also preferable that the voltage applied to the control electrode is controlled in the carrier extraction process. In this case, it becomes possible to control the residual carrier in accordance with the situation in the semiconductor device, thus resulting in a small turn-off.

It is also preferable that, in the carrier extraction process, the voltage applied to the control electrode is controlled after the current flowing through the gate electrode has reached its maximum. In this case, the extraction of the residual carrier in the semiconductor device can be conducted immediately upon switching over to the transistor operation, thus resulting in a small turn-off.

BEST MODE FOR CARRYING OUT THE INVENTION

The invention is hereinafter described in detail with reference to the accompanying drawings. Note that the invention relates to a semiconductor device such as Gate Commutated Turn-off Thyristor (GCT) having a four-layer structure (PNPN structure).

Mode 1

Figure 1:
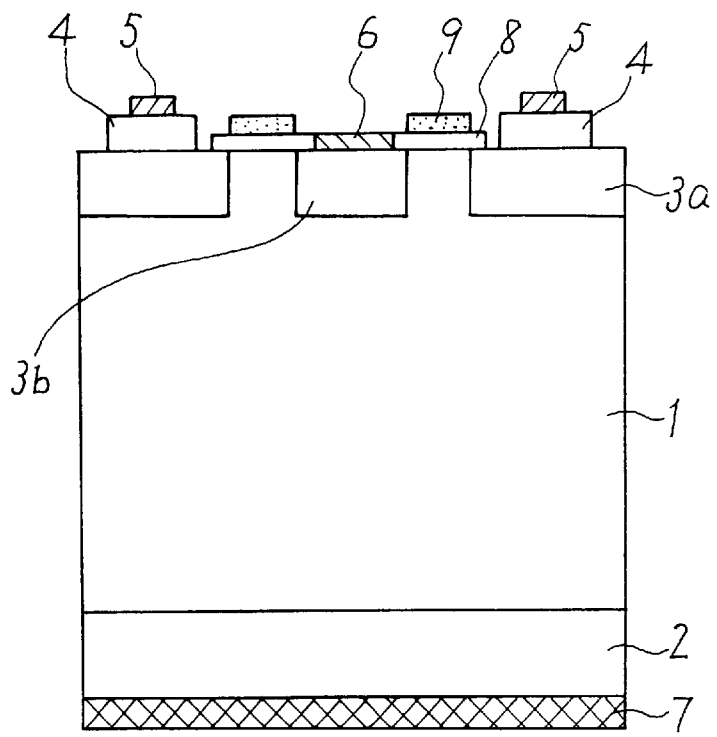
FIG. 1 is a sectional drawing showing a semiconductor device according to mode 1 of the present invention.

FIG. 1 is a sectional drawing showing an arrangement of a semiconductor device according to mode 1 of the invention.

Figure 2:
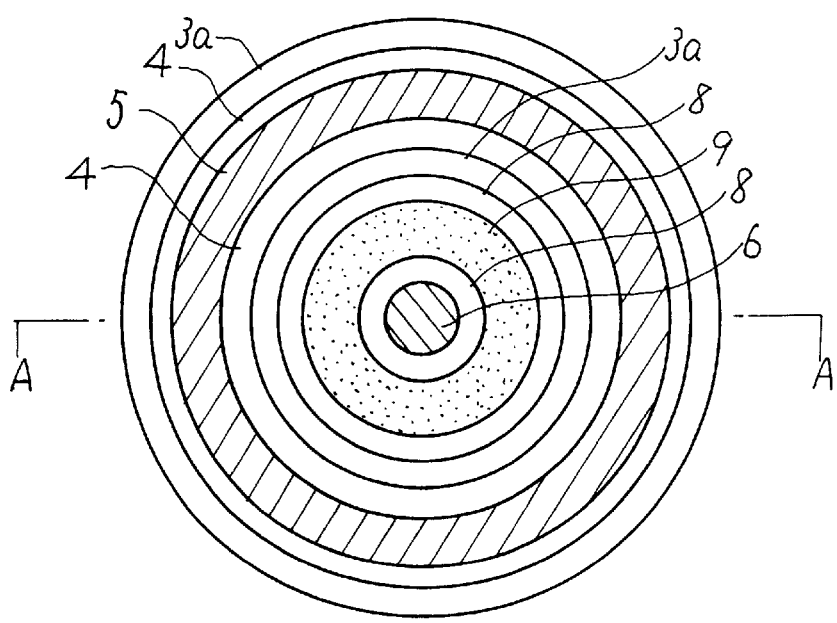
FIG. 2 is a plan view showing the semiconductor device according to mode 1 of the invention.

FIG. 2 is a plan view showing the semiconductor device viewed from cathode side according to mode 1 of the invention. FIG. 1 is a sectional view taken along the line A—A shown in FIG. 2.

In FIGS. 1 and 2, reference numeral 1 is an N-type base region (a second region) made of an N-type semiconductor substrate, and numeral 2 is a P-type emitter region (a first region) made of a P-type semiconductor formed on one side of the N-type base region 1. Numeral 3a is a first P-type base region (a third region) made of a P-type semiconductor formed on the other side of the N-type base region 1. Numeral 3b is a second P-type base region (a fourth region) formed on the other side of the N-type base region 1 to be separated by a predetermined distance from the first P-type base region 3a. The second P-type base region 3b is formed to be a circular form in the central portion on the other side of the N-type base region 1. And the first P-type base region 3a is formed to surround the second P-type base region 3b and is separated therefrom by a predetermined distance. Numeral 4 is an N-type emitter region (a fifth region) made of a ring form N-type semiconductor formed on the first P-type base region 3a.

Numeral 5 is a cathode electrode (a second electrode) made of a metal such as aluminium formed on the N-type emitter region 4. Numeral 6 is a gate electrode made of a metal such as aluminium formed on the second P-type base region 3b, and numeral 7 is an anode electrode (a first electrode) made of a metal such as aluminium formed on the P-type emitter region 2.

Reference numeral 8 is an insulation layer formed on the separate region between the first and second P-type base region 3a, 3b in the N-type base region 1. This insulation layer 8 may be made, for example, of an oxide film. Numeral 9 is a control electrode made of a metal such as aluminium and is used to apply a voltage through the insulation layer 8 making it possible to control the channel in the channel formation region and extract the residual carrier in the transistor operation.

As shown in FIG. 2, the circular gate electrode 6 is formed in the central portion of the semiconductor device. The torus-shaped insulation layer 8 surrounds the gate electrode 6, over which the torus-shaped control electrode 9 is further formed. The torus-shaped cathode electrode 5 is further formed surrounding the insulation layer 8.

Then, operation of the semiconductor device shown in FIGS. 1 and 2 is hereinafter described.

Firstly, turn-on operation of the semiconductor device shown in FIGS. 1 and 2 is described below. To turn on the mentioned semiconductor device, a voltage is applied between the anode electrode 7 and the cathode electrode 5 of the semiconductor device shown in FIG. 1 so that electric potential of the anode electrode 7 is positive with respect to the electric potential of the cathode electrode 5.

Then, a negative voltage is applied to the control electrode 9 so that, through the insulation layer 8, a negative voltage is applied to the channel formation region (the N-type base region 1 between the first P-type base region 3a and the second P-type base region 3b) in order to form a channel in the channel formation region. By forming this channel, the first P-type base region 3a and the second P-type base region 3b become electrically connected.

In this state, the P-N junction between the N-type base region 1 and the first and second P-type base region 3a, 3b is reverse biased, so no electrical current flows between the anode electrode 7 and the cathode electrode 5.

However, in this state, when a positive voltage is applied to the gate electrode 6 in order to make the electric potential of the second P-type base region 3b (the first P-type base region 3a) higher than the electric potential of the N-type emitter region 4, the N-type emitter region 4 and the first and second P-type base regions 3a, 3b become forward biased. This brings about formation of excess carrier in the first and second P-type base regions 3a, 3b. Due to this excess carrier, the first and second P-type base regions 3a, 3b become activated, and as a result the depletion layer around the P-N junction between the N-type emitter region 1 and the first and second P-type base regions 3a, 3b vanishes. This means that electrical current may flow through the P-N junction. In other words, the main current flows from the anode electrode 7 to the cathode electrode 5, thereby an on state being achieved.

Next, turn-off operation of the semiconductor device shown in FIGS. 1 and 2 is hereinafter described. The turn-off operation is an operation which returns the semiconductor device to a deactivated state by cutting off the main current flowing from the anode electrode 7 to the cathode electrode 5 in its turned on state.

First, a negative voltage is applied to the control electrode 9 when the main current is flowing from the anode electrode 7 to the cathode electrode 5. This brings about the formation of a channel between the first P-type base region 3*a* and the second P-type base region 3*b*, whereby the area between the first P-type base region 3*a* and the second P-type base region 3*b* becomes electrically conducive.

Under such a state, in order to commutate the current from the cathode electrode 5 to the gate electrode 6, a negative voltage is applied to the gate electrode 6 so that electric potential of the gate electrode 6 becomes negative with respect to the electric potential of the cathode electrode 5. In this manner, a reverse bias is applied between the cathode electrode 5 and the gate electrode 6, and the main current flowing through the cathode electrode 5 is instantaneously commutated to the gate electrode 6. Thus, by commutating the main current to the gate electrode 6, the thyristor operation, in which the main current flows through the P-type emitter region 2, the N-type base region 1, the first P-type base region 3*a* and the N-type emitter region 4 in the on state, switches over to the transistor operation, in which the main current flows through the P-type emitter region 2, the N-type base region 1, and the first and second P-type base regions 3*a*, 3*b*.

At this point, even after switching to the transistor operation, the application of the negative voltage to the control electrode 9 mentioned is maintained. As a result, the residual carrier existing in the N-type base region 1 can be extracted into the channel region, and through this channel region, the carrier can be extracted from the gate electrode 6. Consequently, the residual carrier in the semiconductor element can be vanished at a faster rate. By controlling the voltage of the control electrode 9 as described above, the extraction of the residual carrier existing in the N-type base region 1 can be controlled. Thus, the turn-off operation can be controlled when the semiconductor device mentioned above switches over to the transistor state.

Next, the controlling method of the control electrode 9 with respect to the turn-off operation is hereinafter described in detail. In the description so far, at the transistor operation, a negative voltage is simply applied to the control electrode 9. However, a more efficient extraction of the residual carrier becomes possible by controlling the applied voltage such that value of the voltage applied to the control electrode 9 is reduced with the passage of time, or by controlling the applied voltage in line with value of the voltage or the current applied to the gate electrode 6.

In addition, by establishing an arrangement in which timing of application of the voltage to the control electrode 9, after switching over to the transistor operation mentioned above, comes at a point of time when the current flowing from the cathode electrode 5 to the gate electrode 6 reaches its maximum, the residual carrier in the semiconductor element may be vanished without any loss. Thus, a more efficient vanishing of the residual carrier in the element can be achieved.

Figure 3:
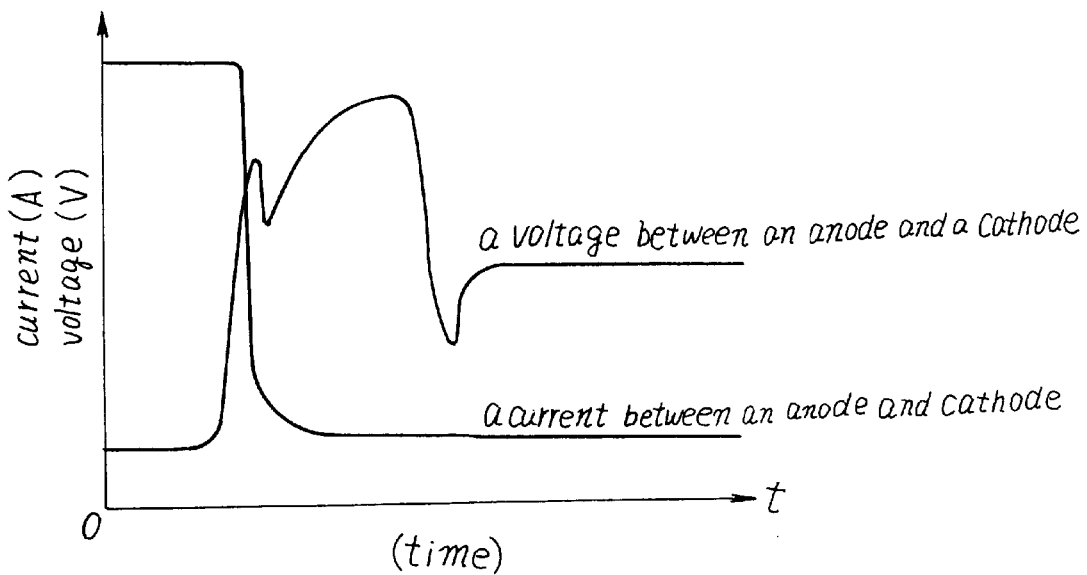
FIG. 3 is a graph showing values of current and voltage in the turn-off operation of the semiconductor device according to mode 1 of the invention.
Figure 9:
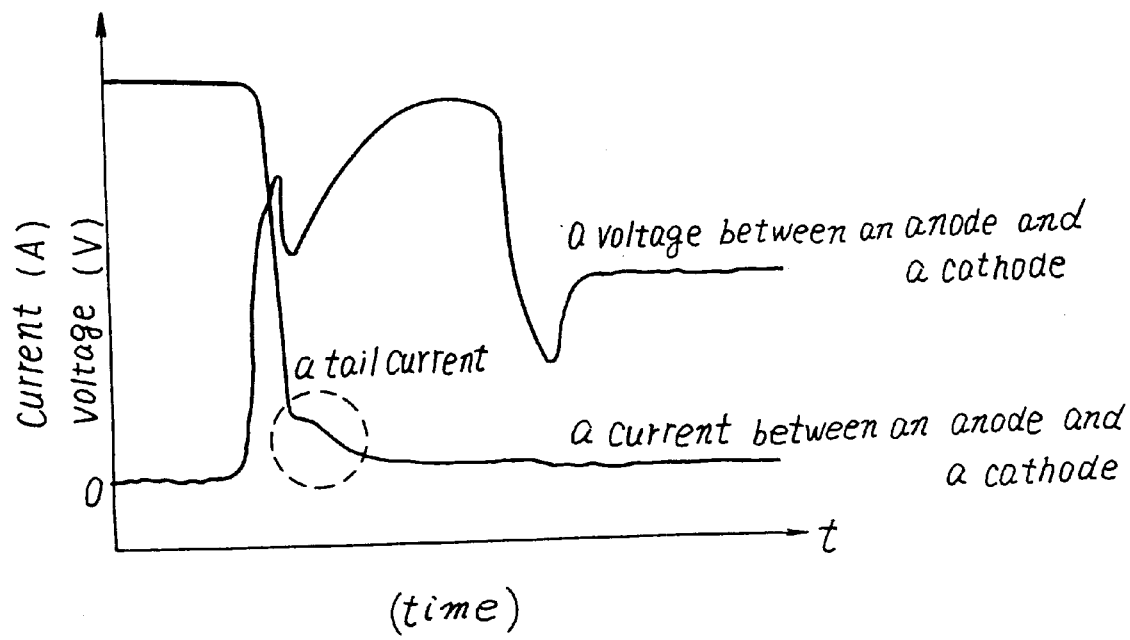
FIG. 9 is a graph showing values of current and voltage in the turn-off operation of the conventional semiconductor device.

FIG. 3 is a graph showing a voltage between the anode and cathode and a current between the anode and cathode in the semiconductor device according to this mode shown FIGS. 1 and 2. In the drawing, axis of ordinates plots the current (A) and the voltage (V), and axis of abscissas plots the time (sec). As shown in FIG. 3, when the main current is commutated from the cathode electrode 5 to the gate electrode 6, the current flowing between the anode and the cathode is rapidly reduced and eventually ceases to flow. In this mode of the invention, since the residual carrier in the semiconductor element can be controlled through the control electrode 9, the residual carrier may be vanished at a higher speed. By this reason, the current flowing between the anode and cathode can be reduced more sharply than that in the conventional semiconductor device shown in FIG. 9. Furthermore, any tail current generated in the conventional semiconductor devices is not generated any more.

Further, as shown in FIG. 3, when conducting the commutation of the main current to the gate electrode 6 and the switch-over from the thyristor operation to the transistor operation, a depletion layer is formed at the P-N junction between the first and second P-type base regions 3*a*, 3*b* and the N-type base region 1. Consequently, the voltage between the anode and the cathode increases as the depletion layer spreads, and eventually the voltage between the anode and the cathode converges to a predetermined voltage level. In this mode of the invention, the residual carrier in the semiconductor element can be controlled through the control electrode 9 after switching over to transistor operation, whereby vanishing speed of the residual carrier can be increased. Formation of the depletion layer may therefore be speeded up so that the voltage between the anode and cathode can reach a predetermined voltage level quicker than that between the anode and cathode of the conventional semiconductor device shown in FIG. 9.

Thus, in this example of the invention, by forming the first P-type base region and the second P-type base region so that they are separated by a predetermined distance and by establishing a control electrode and an insulation layer which makes it possible to form a channel between the two regions, the current flowing through the cathode electrode can be instantaneously commutated to the gate electrode at the time of turning-off, whereby even in the following transistor operation, the turn-off operation can be controlled by manipulating the voltage applied to the control electrode. Accordingly, a high precision control in which turn-off loss is small and turn-off speed is high can be achieved.

Furthermore, it is possible to vanish the residual carrier efficiently after the commutation of current. This is because, as the current flowing through the cathode electrode is commutated to the gate electrode at the point of turn-off, the voltage applied to the control electrode is controlled so that the voltage is applied after the gate current reaches its maximum level.

Mode 2

Now, a semiconductor device according to mode 2 of the invention is hereinafter described with reference to FIG. 4.

Figure 4:
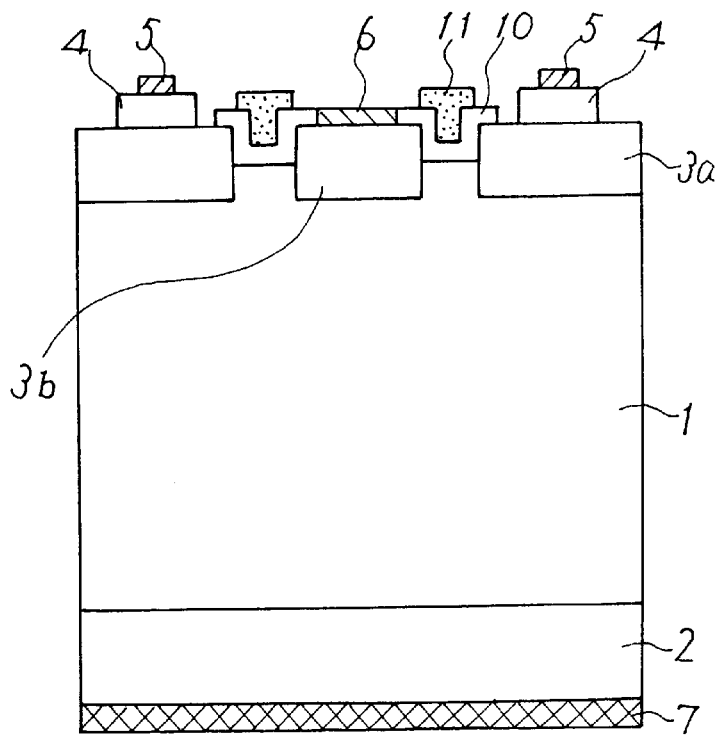
FIG. 4 is a sectional view showing a semiconductor device according to mode 2 of the invention.

FIG. 4 is a sectional view showing an arrangement of the semiconductor device according to mode 2 of the invention. FIG. 4 is a sectional view taken along the line A—A shown in FIG. 2. Among the elements of which reference numerals are indicated in FIG. 4, description of those that are indicated by the same reference numerals indicated in FIGS. 1 and 2 are omitted herein. FIG. 4 differs from FIG. 1 in the aspect that the insulation layer 8 is formed at a different position. More specifically, in the semiconductor device according to this mode 2, the insulation layer 8 and the control electrode 9 necessary for the channel formation both shown in FIG. 1 are formed between the first P-type base region 3a and the second P-type base region 3b. In other words, face of the insulation layer side of the control electrode is formed in such a manner as to be lower than the surfaces of the first and second P-type base regions 3a, 3b.

In the drawing, reference numeral 10 is an insulation layer composed, for example, of an oxide layer provided to make it possible to establish an electrical connection between the first and second P-type base regions 3a, 3b through a channel. This insulation layer 10 is provided such that a bottom portion thereof is formed between the first and second P-type base regions 3a, 3b. Numeral 11 is a control electrode to apply a voltage through the insulation layer 10, and is formed to extend outward from inside a concave of the insulation layer 10. Face on the insulation layer 10 side of the control electrode 11 is therefore formed lower than the surface of the first and second P-type base regions 3a, 3b.

In this manner, by forming the control electrode 11 so that it extends from inside the concave of the insulation layer 10, and by making the face on the insulation layer 10 of the control electrode 11 lower than the surface of the first and second P-type base regions 3a, 3b through the insulation layer 10, the same function and advantage as the aforementioned semiconductor device shown in FIG. 1 is achieved. Furthermore, in this mode, it becomes possible to apply a voltage deeper into the N-type base region 1 (i.e., closer to the anode electrode 7) and thus extract the residual carrier from the deeper position (i.e., closer to the anode electrode 7). This means that more residual carrier can be controlled, and for this reason a more precise control becomes possible, which eventually results in faster turn-off operation.

It is to be noted that although the insulation layer shown in FIG. 4 presents a strictly concave form in section, it is not always necessary to limit to this form only, and any other form can be adopted.

Mode 3

Figure 5:
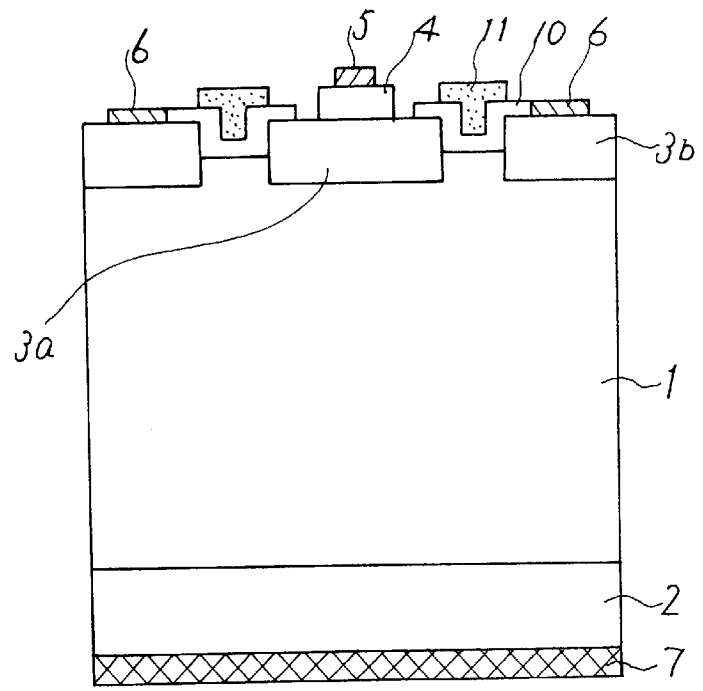
FIG. 5 is a sectional view showing a semiconductor device according to mode 3 of the invention.
Figure 6:
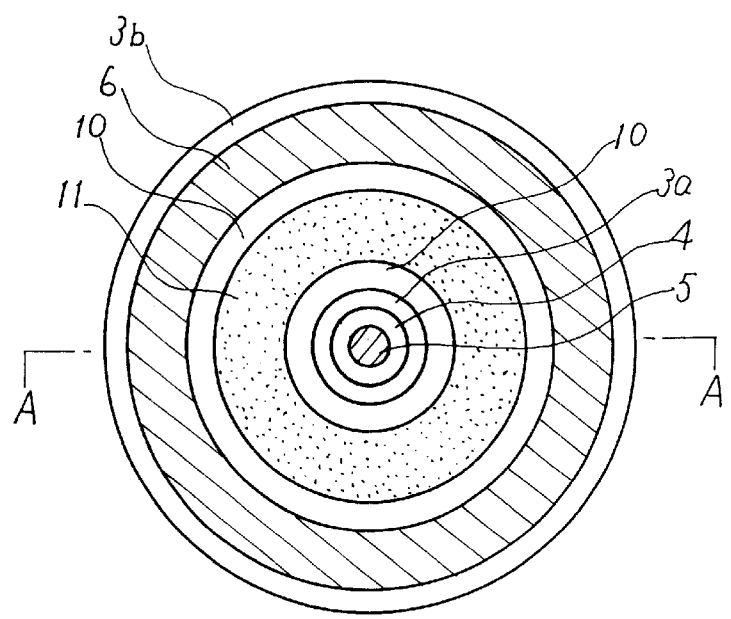
FIG. 6 is a plan view showing the semiconductor device according to mode 3 of the invention.
Figure 7:
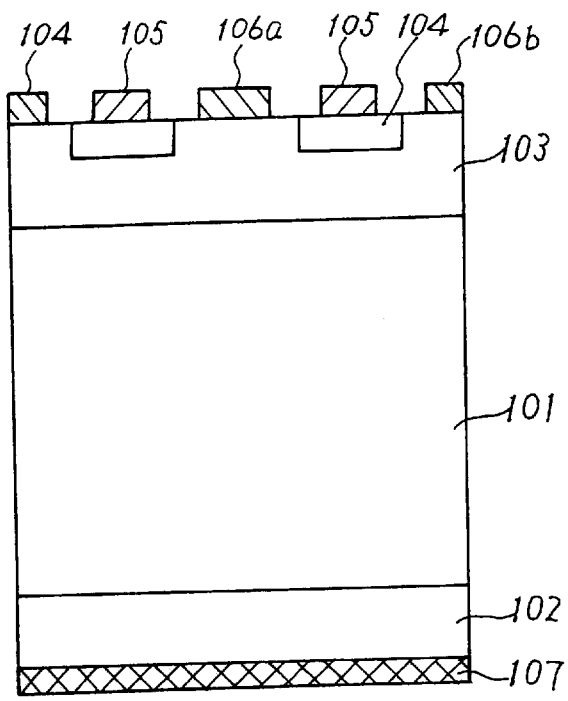
FIG. 7 is a sectional drawing showing a conventional semiconductor device.
Figure 8:
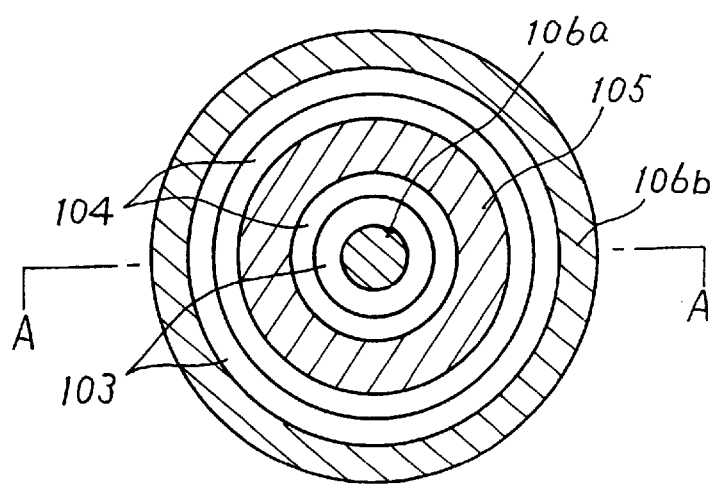
FIG. 8 is a plan view drawing showing the conventional semiconductor device.

FIG. 5 is a sectional view showing an arrangement of the semiconductor device according to mode 3 of the invention. FIG. 6 is a plan view of the semiconductor device according to mode 3 of the invention viewed from cathode side. FIG. 5 is a sectional view taken along the line A—A shown in FIG. 6.

Among the elements of which reference numerals are indicated in FIGS. 5 and 6, description of those that are indicated by the same reference numerals indicated in FIGS. 1 and 2 are omitted herein. FIGS. 5 and 6 differ from FIGS. 1 and 2 in the aspect that the first P-type base region 3a and the second P-type base region 3b is formed at different positions. More specifically, in this semiconductor device according to mode 3, the first P-type base region 3a is formed in the central portion on one side of the N-type base region 1 and takes a circular shape. The second base region 3b is formed in such a manner as to be separated from the first base region 3a by a predetermined distance, and surrounds the first base region 3a.

In the drawing, reference numeral 3a is the first P-type base region made of a P-type semiconductor formed on one side of the N-type base region 1. Numeral 3b is the second P-type base region formed on one side of the N-type base region 1 in such a manner as to be separated from the first P-type base region 3a by a predetermined distance. The first P-type base region 3a is formed on the central portion of one side of the N-type base region 1 and takes a circular shape. The second P-type base region 3b is formed in such a manner as to surround the first P-type base region 3a and is separated from the first P-type base region 3a by a predetermined distance. Numeral 4 is the N-type emitter region made of an N-type semiconductor formed on the first P-type base region 3a, and numeral 5 is the cathode electrode formed on the N-type emitter region 4. Numeral 6 is the gate electrode formed on the second P-type base region 3b. Description of the rest of the reference numerals is omitted herein as they refer to the same elements shown in FIGS. 1 and 2 in association with mode 1 of the invention.

As shown in FIG. 6, the circular-shaped cathode electrode 5 is formed on the central portion of the semiconductor device, and the torus-shaped control electrode 11 is formed on the torus-shaped insulation layer 10 to surround the cathode electrode 5. The torus-shaped gate electrode 6 is formed to surround the insulation layer 10.

Next, operation of the semiconductor device shown in FIGS. 5 and 6 is hereinafter described. This semiconductor device according to mode 3 differs from the semiconductor device shown in FIGS. 1 and 2 only in the aspect that the first and second P-type base regions 3a, 3b are formed at different positions. Therefore, operation thereof is similar to that of the semiconductor device according to mode 1 shown in FIGS. 1 and 2.

Thus, in this example of the invention, by forming the first P-type base region and the second P-type base region so that they are separated by a predetermined distance and by establishing a control electrode and an insulation layer which makes it possible to form a channel between the two regions, the current flowing through the cathode electrode can be instantaneously commutated to the gate electrode at the time of turning-off, whereby even in the following transistor operation, the turn-off operation can be controlled by manipulating the voltage applied to the control electrode. Accordingly, a high precision control in which turn-off loss is small and turn-off speed is high can be achieved.

In each of the foregoing modes of the invention, using an N-type semiconductor substrate as the N-type base region, the P-type emitter region and the P-type base region are provided on one side of the substrate, and the N-type emitter region is formed on the P-type base region. It is also preferable that using a P-type semiconductor substrate as the P-type base region, an N-type emitter region and an N-type base region is provided on one side of the substrate, and a P-type emitter region is formed on the N-type base region.

As has been described so far, the semiconductor device according to the present invention is applicable to a semiconductor device for a large amount of electric power such as GCT dealing with a high voltage and a large amount of current, making it possible to operate at a maximum breaking current of 4000A under an operating voltage of DC 3000V without any snubber circuit.

What is claimed is:

1. A semiconductor device comprising:

a first electrode;

a first region of first conductivity type provided on said first electrode;

a second region of second conductivity type provided on said first region;

a third region and a fourth region of first conductivity type respectively at least partly embedded in said second region with a predetermined distance from each other to allow formation of a channel region in said second region;

a fifth region of second conductivity type provided on said third region;

a second electrode provided on said fifth region;

a gate electrode provided on and in direct contact with said fourth region;

an insulation layer provided on a separate region of said second region between said third and fourth regions; and a control electrode configured to control said channel region through said insulation layer.

2. The semiconductor device as set forth in claim 1, wherein the third region is formed in such a manner as to surround the fourth region.

3. The semiconductor device as set forth in claim 1, wherein the fourth region is formed in such a manner as to surround the third region.

4. The semiconductor device as set forth in claim 1, wherein face of the control electrode on the insulation layer side is lower than the surface of the third and fourth regions.

5. A gate commutated turn-off thyristor, comprising:

a four-layer semiconductor element;

an anode electrode on one side of said semiconductor element;

a cathode electrode on an other side of said semiconductor element;

a gate electrode on said other side of said semiconductor element; wherein said semiconductor element comprises:

means for passing a current flow from said anode electrode to said cathode electrode during an on-state operation; and means for commutating said current flow from said anode electrode through said cathode electrode to said gate electrode during a turn-off operation, the means for commutating being provided under the gate electrode; and wherein said gate commutated turn-off thyristor further comprises means for extracting residual carriers from said semiconductor element through said gate electrode during said turn-off operation.

6. The gate commutated turn-off thyristor according to claim 5, wherein said means for extracting comprises:

an insulation film in contact with said semiconductor element and a control electrode on said insulation film.

7. The gate commutated turn-off thyristor according to claim 6, wherein said insulation film and said control electrode are on said other side of said semiconductor element between said cathode electrode and said gate electrode.

8. The gate commutated turn-off thyristor according to claim 5, wherein said means for extracting comprises means for controlling a channel region in said semiconductor element.

* * * * *